(12) United States Patent
Yang

(10) Patent No.: US 12,335,587 B2
(45) Date of Patent: Jun. 17, 2025

(54) CAMERA MOTOR, CAMERA MODULE AND ELECTRONIC DEVICE

(71) Applicant: GUANGDONG OPPO MOBILE TELECOMMUNICATIONS CORP., LTD., Guangdong (CN)

(72) Inventor: Song Yang, Guangdong (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 349 days.

(21) Appl. No.: 18/090,735

(22) Filed: Dec. 29, 2022

(65) Prior Publication Data

US 2023/0141509 A1    May 11, 2023

Related U.S. Application Data

(63) Continuation of application No. PCT/CN2021/105814, filed on Jul. 12, 2021.

(30) Foreign Application Priority Data

Aug. 17, 2020  (CN) ......................... 202010826997.1

(51) Int. Cl.
   *H04N 23/54*    (2023.01)
   *H04N 23/55*    (2023.01)
   *H04N 23/57*    (2023.01)

(52) U.S. Cl.
   CPC ............. *H04N 23/54* (2023.01); *H04N 23/55* (2023.01); *H04N 23/57* (2023.01)

(58) Field of Classification Search
   CPC ........ H04N 23/50; H04N 23/51; H04N 23/54; H04N 23/55; H04N 23/57; G03B 2205/0046; G03B 2205/0069; G03B 30/00
   See application file for complete search history.

(56) References Cited

U.S. PATENT DOCUMENTS

| 10,495,844 B2 | 12/2019 | Sato et al. |
| 2008/0253003 A1 | 10/2008 | Shin et al. |

(Continued)

FOREIGN PATENT DOCUMENTS

| CN | 104767916 A | 7/2015 |
| CN | 204498233 U | 7/2015 |

(Continued)

OTHER PUBLICATIONS

International Search Report and Written Opinion with English Translation for PCT Application PCT/CN2021/105814 mailed Oct. 12, 2021. (17 pages).

(Continued)

*Primary Examiner* — Daniel M Pasiewicz
(74) *Attorney, Agent, or Firm* — Young Basile Hanlon & MacFarlane, P.C.

(57) ABSTRACT

A camera motor, a camera module, and an electronic device. The camera motor includes a base, a carrying member, and a drive member. A bottom surface of the base is recessed to define a receiving slot, and the receiving slot passes through a side of the base; the receiving slot is configured to receive at least one of a light filter module, an image sensor, and a sensor circuit board of the camera module. The carrying member is configured to carry a lens, arranged in the base, and movable along an optical axis of the lens within the base. The drive member is connected to the carrying member and configured to drive the carrying member to move along the optical axis of the lens.

20 Claims, 12 Drawing Sheets

(56) References Cited

U.S. PATENT DOCUMENTS

| | | | |
|---|---|---|---|
| 2008/0304821 A1 | 12/2008 | Jeung et al. | |
| 2009/0067068 A1 | 3/2009 | Yu et al. | |
| 2014/0104486 A1 | 4/2014 | Seol et al. | |
| 2017/0108705 A1* | 4/2017 | Yu ........................... | G02B 7/09 |
| 2019/0327396 A1 | 10/2019 | Wang et al. | |
| 2020/0036897 A1 | 1/2020 | Kuo et al. | |
| 2020/0218032 A1 | 7/2020 | Cho et al. | |

FOREIGN PATENT DOCUMENTS

| | | | |
|---|---|---|---|
| CN | 104917944 | A | 9/2015 |
| CN | 106959569 | A | 7/2017 |
| CN | 108712591 | A | 10/2018 |
| CN | 110199514 | A | 9/2019 |
| CN | 209486446 | U | 10/2019 |
| CN | 111970421 | A | 11/2020 |
| TW | 201732341 | A | 9/2017 |
| WO | 2017010745 | A1 | 1/2017 |

OTHER PUBLICATIONS

Chinese First Office Action with English Translation for CN Application 202010826997.1, mailed Jun. 25, 2021 (18 pages).
Chinese Notification to Grant Patent Right for Invention with English Translation for CN Application 202010826997.1, mailed Dec. 27, 2021. (7 pages).
Extended European Search Report for EP Application 21857411.9 mailed Jan. 3, 2024. (7 pages).

\* cited by examiner

CAMERA MOTOR, CAMERA MODULE AND ELECTRONIC DEVICE

CROSS-REFERENCE TO RELATED APPLICATION(S)

The present disclosure is a continuation-application of International (PCT) Patent Application No. PCT/CN2021/105814, filed on Jul. 12, 2021, which claims priority of Chinese Patent Application No. 202010826997.1, filed on Aug. 17, 2020, the entire contents of both of which are hereby incorporated by reference.

TECHNICAL FIELD

The present disclosure relates to the field of electronic technologies, and in particular to a camera motor, a camera module, and an electronic device.

BACKGROUND

The photo function of mobile phones and other electronic devices is realized by automatic focus of camera modules, and the camera motor is an indispensable core component of the camera module for automatic focus. With the increasing demand for thin and light electronic products, in mobile phones and other electronic products, the conventional motor design has technical limitations in the size of a height direction, which cannot meet the design requirements of thin and light mobile phones and other electronic products.

SUMMARY

The present disclosure provides a camera motor, a camera module, and an electronic device.

The camera motor of the present disclosure is applied to a camera module and includes:
- a base; wherein a bottom surface of the base is recessed to define a receiving slot, and the receiving slot passes through a side of the base; the receiving slot is configured to receive at least one of a light filter module, an image sensor, and a sensor circuit board of the camera module;
- a carrying member, configured to carry a lens, arranged in the base, and movable along an optical axis of the lens within the base; and
- a drive member, connected to the carrying member and configured to drive the carrying member to move along the optical axis of the lens.

The camera module of the present disclosure includes the camera motor as above, and
at least one of the light filter module, the image sensor, and the sensor circuit board, arranged in the receiving slot.

The electronic device of the present disclosure includes a shell and the camera module as above arranged in the shell.

Additional aspects and advantages of the embodiments of the present disclosure will be given in part in the following description, and will become apparent in part from the following description, or from the practice of the embodiments of the present disclosure.

BRIEF DESCRIPTION OF DRAWINGS

The foregoing and/or additional aspects and advantages of the present disclosure will become apparent and easily understood from the description of the embodiments in conjunction with the accompanying drawings.

REFERENCE NUMERALS DESCRIPTION

Figure 1:
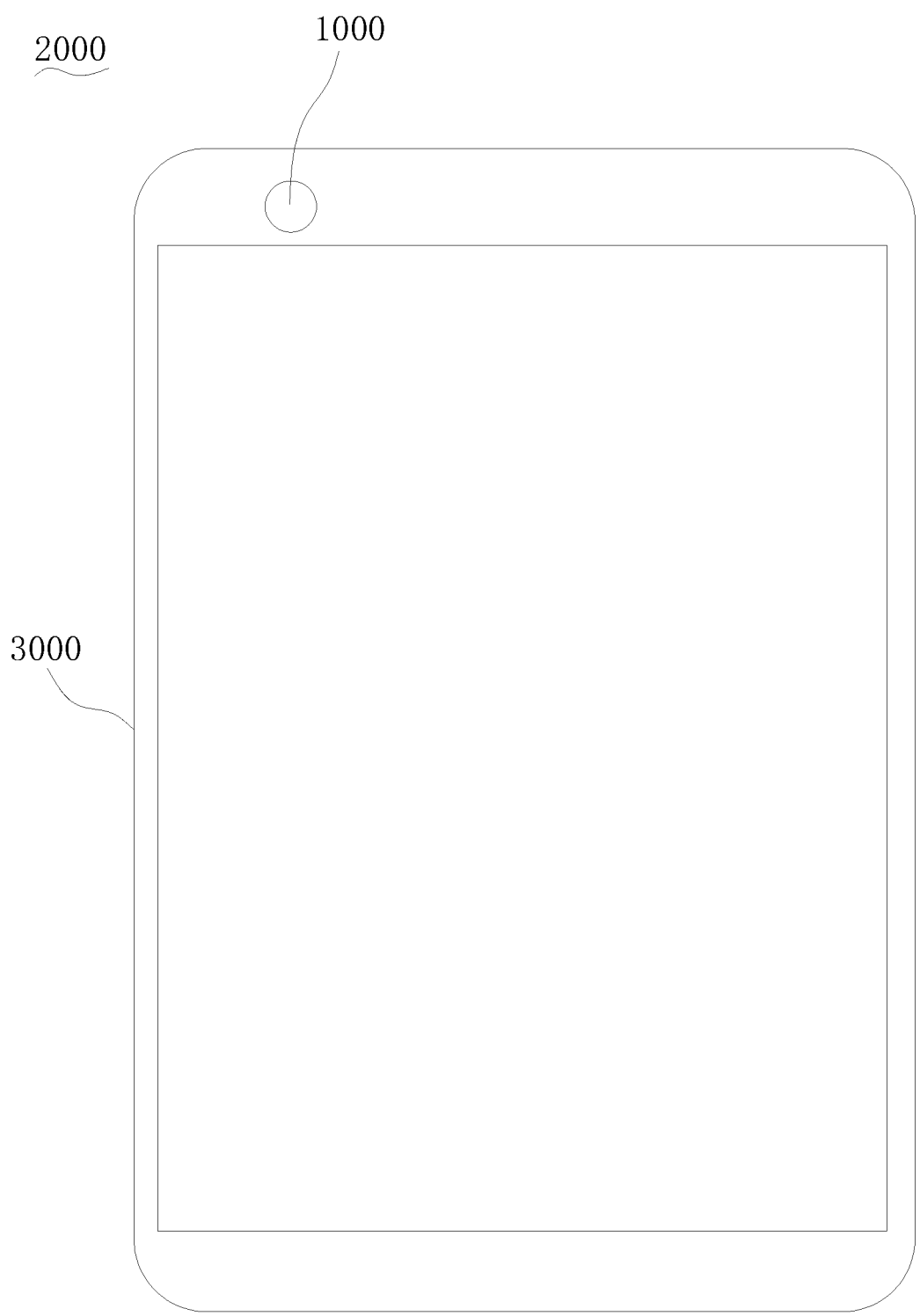
FIG. 1 is a structural schematic view of an electronic device according to an embodiment of the present disclosure.

Camera module 1000.
Camera motor 100, base 10, receiving slot 101, first mounting portion 11, first bottom surface 111, first mounting cavity 112, first top surface 113, side wall 114, first through hole 115, recess 116, carrying tab 117, avoidance slot 118, second mounting portion 12, second bottom surface 121, second mounting cavity 122, second top surface 123, side surface 124, side wall 126, first side wall 1261, second side wall 1262, second through hole 127, third through hole 128, positioning tab 129, retaining wall 130, ball track 131, carrying member 20, first carrying portion 21, mounting hole 211, first impact tab 212, support tab 213, second impact tab 214, second carrying portion 22, first mounting slot 221, second mounting slot 222, drive member 30, coil 31, first magnetic member 32, circuit board 33, first portion 331, second portion 332, pin 333, housing 40, fourth through hole 41, limit tab 42, position detection part 50, detection member 51, sensing member 52, enhancement plate 60, ball 70, dustproof ring 80, light filter module 200, image sensor 300, sensor circuit board 400, lens 500.
Electronic device 2000, shell 3000.

DETAILED DESCRIPTION

Embodiments of the present disclosure are further described below in connection with the accompanying drawings. The same or similar reference numerals in the accompanying drawings indicate the same or similar components or components having the same or similar functions thorough the present disclosure.

Further, the embodiments of the present disclosure described below in conjunction with the accompanying drawings are exemplary, intended only to explain the embodiments of the present disclosure, and not to be construed as limiting the present disclosure.

The following disclosure provides a number of different embodiments or examples for implementing the different structures of the present disclosure. To simplify the description of the present disclosure, the components and settings of particular examples are described below. They are, of course, examples only and are not intended to limit the present disclosure. In addition, the present disclosure may repeat reference numbers and/or reference letters in different examples; such repetition is for the purpose of simplicity and clarity and is not in itself indicative of a relationship between the various embodiments and/or settings discussed.

The camera motor of the present disclosure includes a base, a carrying member, and a drive member; wherein a bottom surface of the base is recessed to define a receiving slot, and the receiving slot passes through a side of the base; the receiving slot is configured to receive at least one of a light filter module, an image sensor, and a sensor circuit board of the camera module; the carrying member is configured to carry a lens, arranged in the base, and movable along an optical axis of the lens within the base; the drive member is connected to the carrying member and configured to drive the carrying member to move along the optical axis of the lens.

In some embodiments, the base includes a first mounting portion and a second mounting portion, and the second mounting portion is connected to a side of the first mounting portion; the first mounting portion includes a first bottom surface, and the second mounting portion includes a second bottom surface; a position of the first bottom surface is lower than a position of the second bottom surface; an inner surface of the receiving slot includes the first bottom surface and a side surface of the second mounting portion.

In some embodiments, the first mounting portion further includes a first top surface, and the second mounting portion further includes a second top surface; the first top surface and the second top surface are flush.

In some embodiments, the carrying member includes a first carrying portion and a second carrying portion connected to the first carrying portion; the first mounting portion defines a first mounting cavity, and the second mounting portion defines a second mounting cavity; the first carrying portion is arranged in the first mounting cavity, and the second carrying portion is arranged in the second mounting cavity; the first carrying portion is configured to arrange the lens, and the second carrying portion is connected to the drive member.

In some embodiments, the first carrying portion defines a mounting hole configured to arrange the lens, and a center axis of the mounting hole coincides with the optical axis of the lens.

In some embodiments, the first mounting portion defines a first through hole passing through the first bottom surface, and the first through hole is communicated with the first mounting cavity and the receiving slot and is concentric with the mounting hole.

In some embodiments, the drive member includes a coil and a first magnetic member; the coil is arranged on the second mounting portion, and the first magnetic member is fixedly arranged on the second carrying portion; the first magnetic member and the coil are arranged opposite each other, and the coil is capable of causing the first magnetic member to drive the carrying member to move along the optical axis of the lens in response to the coil being energized.

In some embodiments, the drive member further includes a circuit board arranged on a side wall of the second mounting portion; the coil is arranged on the circuit board and is electrically connected to the circuit board.

In some embodiments, the side wall of the second mounting portion defines a second through hole, and the coil is arranged in the second through hole.

In some embodiments, the circuit board includes a first portion and a second portion that are perpendicular to each other; the second mounting portion includes a first side wall and a second side wall that are perpendicular to each other and intersect; the first side wall, the second side wall, and the second bottom surface together enclose to define the second mounting cavity; the first portion is arranged on the first side wall, the second portion is arranged on the second side wall, and the 31 is arranged on the first portion.

In some embodiments, a positioning tab is formed on each of the first side wall and the second side wall, and a positioning hole is defined on each of the first portion and the second portion; each positioning tab cooperates with a corresponding positioning hole.

In some embodiments, the camera motor further includes an enhancement plate; wherein the first portion is arranged on the enhancement plate, and the enhancement plate is arranged on the second mounting portion.

In some embodiments, the second carrying portion defines a first mounting slot, and the first magnetic member is arranged in the first mounting slot.

In some embodiments, the camera motor further includes a position detection part including a detection member and a sensing member; wherein the detection member is arranged on the second mounting portion, and the sensing member is arranged on the second carrying portion; the detection member is configured to sense a position of the sensing member, for detecting a relative position of the carrying member and base.

In some embodiments, the detection member includes a Hall sensor and the sensing member includes a second magnetic member; the Hall sensor is configured to detect the relative position of the carrying member and the base, by sensing a magnetic field strength to detect a relative position of the Hall sensor and the second magnetic member.

In some embodiments, a side wall of the second mounting portion defines a third through hole, and the Hall sensor is disposed in the third through hole; the second carrying portion defines a second mounting slot, and the second magnetic member is arranged in the second mounting slot.

In some embodiments, the detection member includes an infrared sensor, and the sensing member includes a reflecting member, capable of reflecting infrared light and arranged on the second carrying portion.

The camera module of the present disclosure includes the camera motor as above, and at least one of the light filter module, the image sensor, and the sensor circuit board, arranged in the receiving slot.

The electronic device of the present disclosure includes a shell and a camera module as above arranged in the shell.

Referring to FIG. 1, the electronic device 2000 of the present disclosure includes a camera module 1000 and a shell 3000 of the present disclosure. The camera module 1000 is arranged inside the shell 3000 and is configured to receive external light for imaging in order to make the electronic device 2000 have a filming function.

Figure 2:
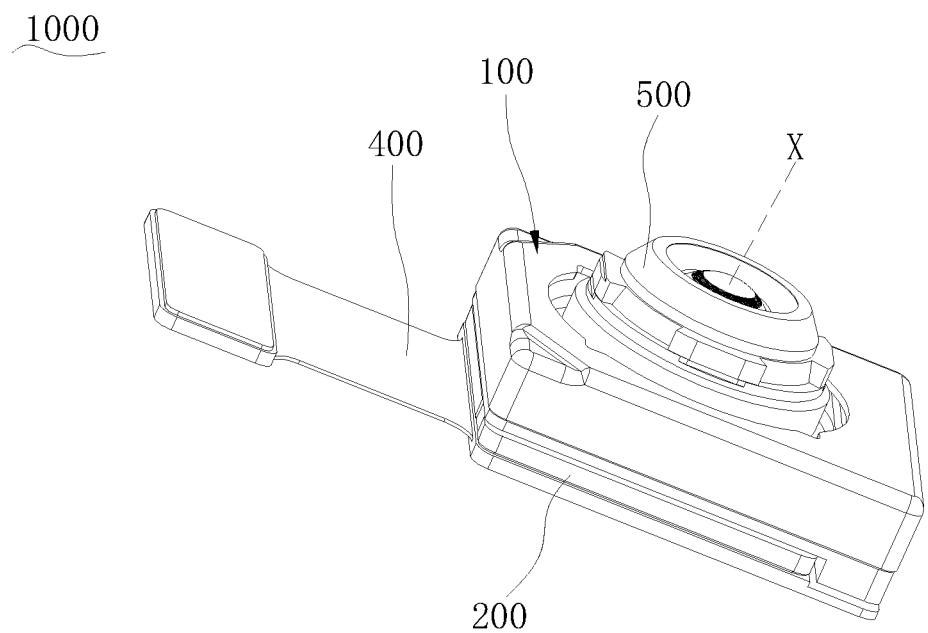
FIG. 2 is a perspective structural schematic view of a camera module according to an embodiment of the present disclosure.
Figure 3:
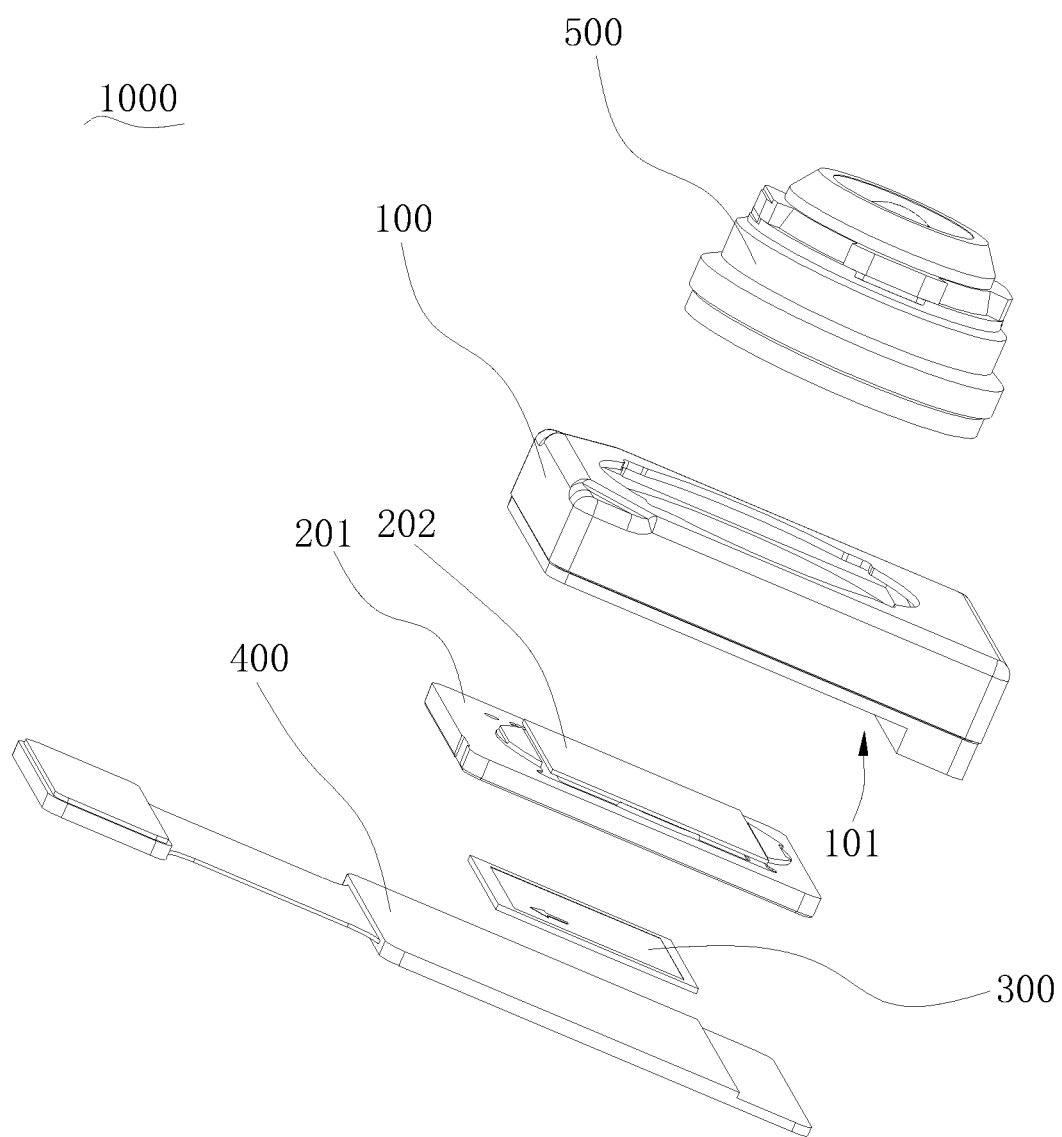
FIG. 3 is an exploded structural schematic view of a camera module according to an embodiment of the present disclosure.
Figure 4:
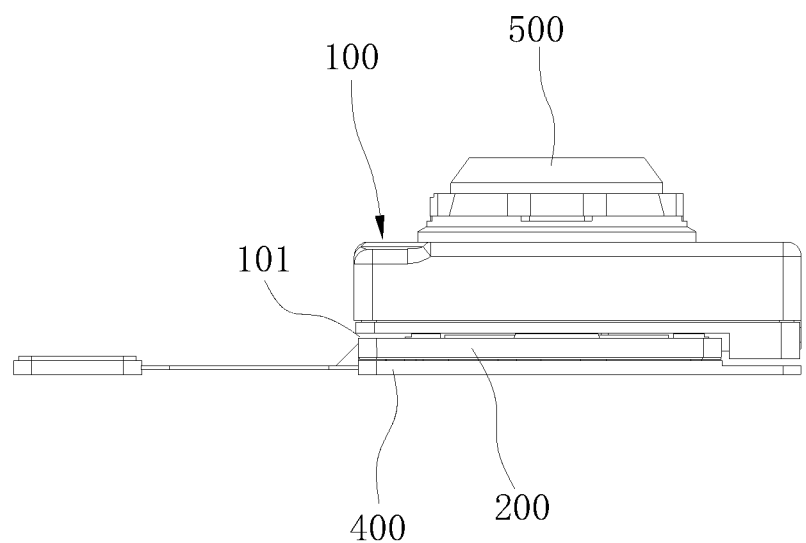
FIG. 4 is a front view of the camera module in FIG. 2.

Referring to FIGS. 2 to 4, the camera module 1000 includes a camera motor 100, a light filter module 200, an image sensor 300, a sensor circuit board 400, and a lens 500. The lens 500, the light filter module 200, and the image sensor 300 are arranged on the camera motor 100, and the camera motor 100 is configured to drive the lens 500 to move along an optical axis X of the lens 500 to achieve an automatic focus function of the camera module 1000. The light filter module 200 and the image sensor 300 are disposed on an optical path of the lens 500, the image sensor 300 is disposed below the light filter module 200, and the image sensor 300 is arranged on the sensor circuit board 400. Light entering from the lens 500 is filtered by the light filter module 200 and can be received by the image sensor 300 for realizing imaging.

It is understood that the electronic device 2000 includes, but is not limited to, mobile phones, tablets and other mobile terminals with photo and/or video functions or other portable electronic devices. In the present disclosure, the camera module 1000 may be an autofocus camera in the electronic device 2000. It is understood that in an electronic device 2000, there may be only one camera module 1000 or multiple camera modules 1000 at the same time, without limitation herein.

Referring to FIGS. 5 to 8, the camera motor 100 of the present disclosure includes a base 10, a carrying member 20, a drive member 30, and a housing 40. The carrying member 20 is arranged in the base 10, the drive member 30 is connected to the carrying member 20, and the housing 40 is sleeved on the base 10. The carrying member 20 is configured to carry the lens 500, and the drive member 30 is configured to drive the carrying member 20 to move for driving the lens 500 along the optical axis X of the lens 500.

Figure 5:
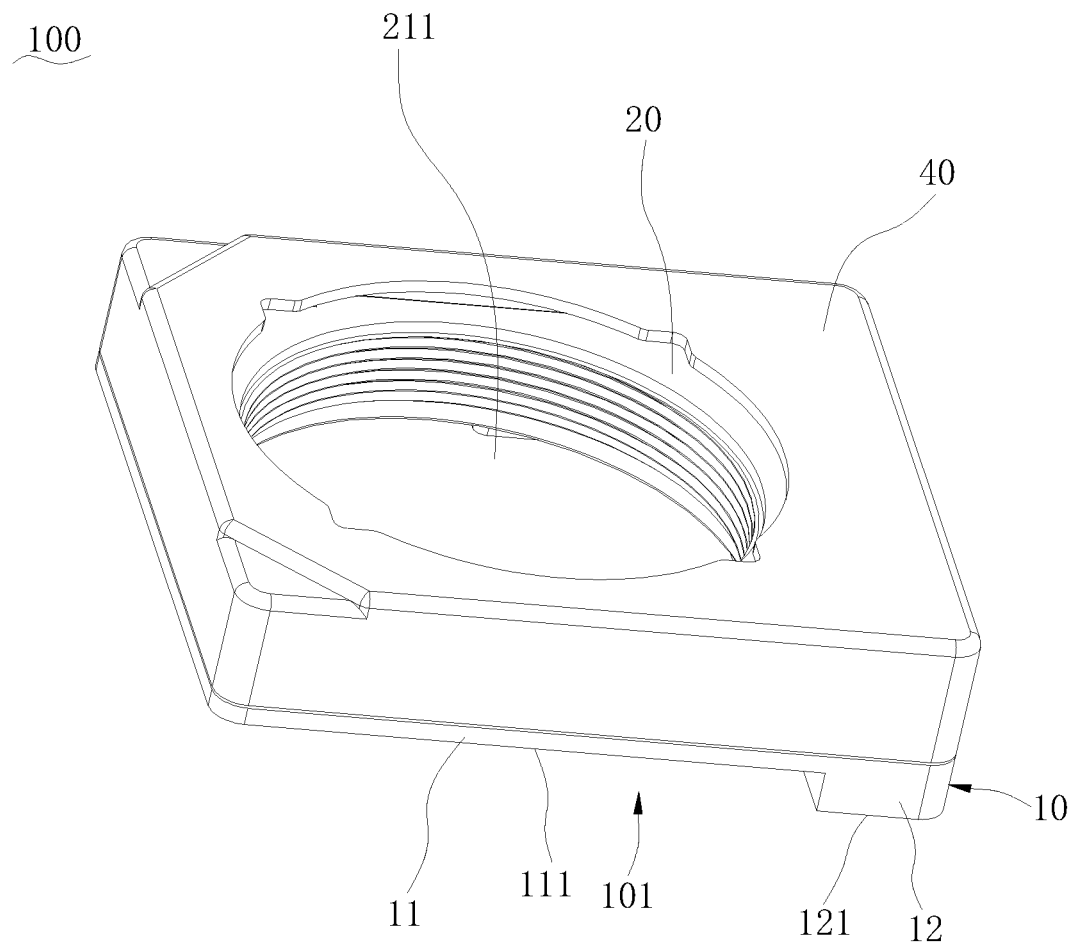
FIG. 5 is a perspective structural schematic view of a camera motor according to an embodiment of the present disclosure.

Referring to FIG. 5, in some embodiments of the present disclosure, a bottom surface of the base 10 is recessed to define a receiving slot 101, and the receiving slot 101 passes through a side of the base 10. Referring to FIGS. 3 and 4 in conjunction, the receiving slot 101 may be configured to receive at least one of the light filter module 200, the image sensor 300, and the sensor circuit board 400. In some embodiments, both the light filter module 200 and the image sensor 300 are received in the receiving slot 101, and the sensor circuit board 300 is disposed outside of the receiving slot 101. It can be understood that in other embodiments, the receiving slot 101 may accommodate only the light filter module 200 or the image sensor 300 or the sensor circuit board 400, or accommodate only the light filter module 200 and the image sensor 300, or accommodate only the image sensor 300 and the sensor circuit board 400, without limitation herein. In addition, referring to FIG. 3, in some embodiments, the light filter module 200 may include a bracket 201 and a filter 202; the filter 202 is arranged on the bracket 201, the bracket 201 is received in the receiving slot 101, and the image sensor 300 is disposed under the bracket 201. Of course, in other embodiments, the specific structure of the light filter module 200 is not limited to the above, as long as it is able to achieve light filtering.

In addition, it is understood that in some embodiments, the camera module 1000 may not include the light filter module 200. In some embodiments, the camera module 1000 may not include the image sensor 300, but rather the image sensor 300 is integrated into the sensor circuit board 400 by means of an integrated combination, without limitation herein.

Referring to FIG. 6 and FIGS. 8 to 10, in some embodiments of the present disclosure, the base 10 includes a first mounting portion 11 and a second mounting portion 12, and the second mounting portion 12 is connected to the first mounting portion 11 and is disposed on a side of the first mounting portion 11. The first mounting portion 11 includes a first bottom surface 111 and a first top surface 113, and the first mounting portion 11 defines a first mounting cavity 112 passing through the first top surface 113, that is, the first mounting portion 11 is recessed downward from the first top surface 113 to define the first mounting cavity 112. The first mounting cavity 112 is configured to accommodate a first carrying portion 21 of the carrying member 20.

The second mounting portion 12 includes a second bottom surface 121 and a second top surface 123, and the second mounting portion 12 defines a second mounting cavity 122 passing through the second top surface 123, that is, the second mounting portion 12 is recessed downward from the second top surface 123 to define the second mounting cavity 122. The second mounting cavity 122 is configured to accommodate a second carrying portion 22 of the carrying member 20.

The top surfaces of both the first mounting portion 11 and the second mounting portion 12 are flush, that is, the first top surface 113 and the second top surface 123 are flush. The second mounting portion 12 is disposed on a side of the first mounting portion 11 and a bottom of the second mounting portion 12 protrudes from a bottom of the first mounting portion 11, that is, the position of the first bottom surface 111 is lower than the position of the second bottom surface 121.

Figure 8:
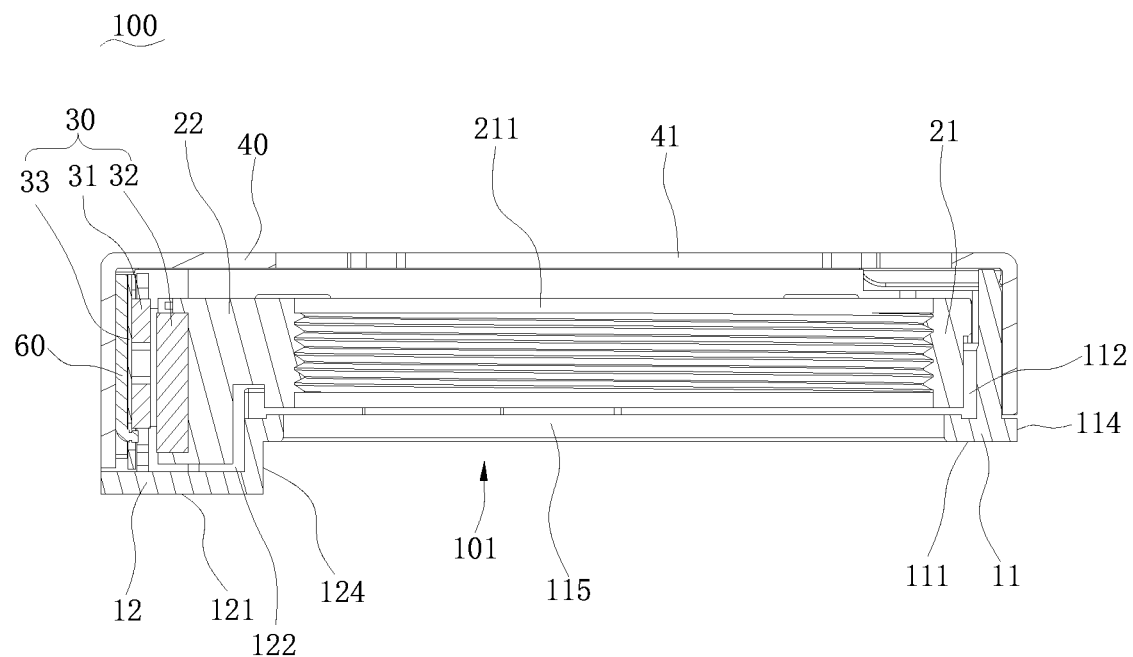
FIG. 8 is a cross-sectional schematic view of the camera motor along VIII-VIII in FIG. 7.

Referring to FIG. 8, in some embodiments, the second mounting portion 12 further includes a side surface 124 connecting the first bottom surface 111 and the second bottom surface 121, and the first bottom surface 111 and the side surface 124 enclose the receiving slot 101, that is, an inner surface of the receiving slot 101 includes the first bottom surface 111 and the side surface 124 of the second mounting portion 12. In this way, since the first bottom surface 111 is lower than the second bottom surface 121. the first bottom surface 111 and the second bottom surface 121 are stepped and connected by the side surface 124, thereby defining the receiving slot 101 with a substantially rectangular cross-section.

Specifically, in some embodiments, the bottom of the second mounting portion 12 protrudes from the first mounting portion 11, and the first mounting portion 11 and second mounting portion 12 form an "L" shaped structure. In this way, the receiving slot 101 may be configured to place other components of the camera module 1000. For example, as shown in FIG. 4, the receiving slot 101 may be configured to place other components of the camera module 1000, such as the light filter module 200 and the image sensor 300, other than the lens 500 and the camera motor 100, such that the other components of the camera module 1000 may be received in the receiving slot 101. Therefore, the height of the camera module 1000 may be effectively reduced, and thus the mobile terminal or electronic device such as a mobile phone with the camera module 1000 may be made thinner and lighter.

It can be understood that in some embodiments of the present disclosure, the base 10 is a one-piece structure. That is, in the present disclosure, the first mounting portion 11 and the second mounting portion 12 may be integrally molded, and the first mounting cavity 112 is connected to the second mounting cavity 122. Specifically, the base 10 may be made of plastic material, for example, by injection molding using a mold to directly form the first mounting portion 11 with the first mounting cavity 112 and the second mounting portion 12 with the second mounting cavity 122. Of course, it is understood that in some embodiments, the base 10 may be made of other materials, such as metal. Further, the base 10 may be formed by machining, such as a CNC machining plant, without limitation herein.

Figure 9:
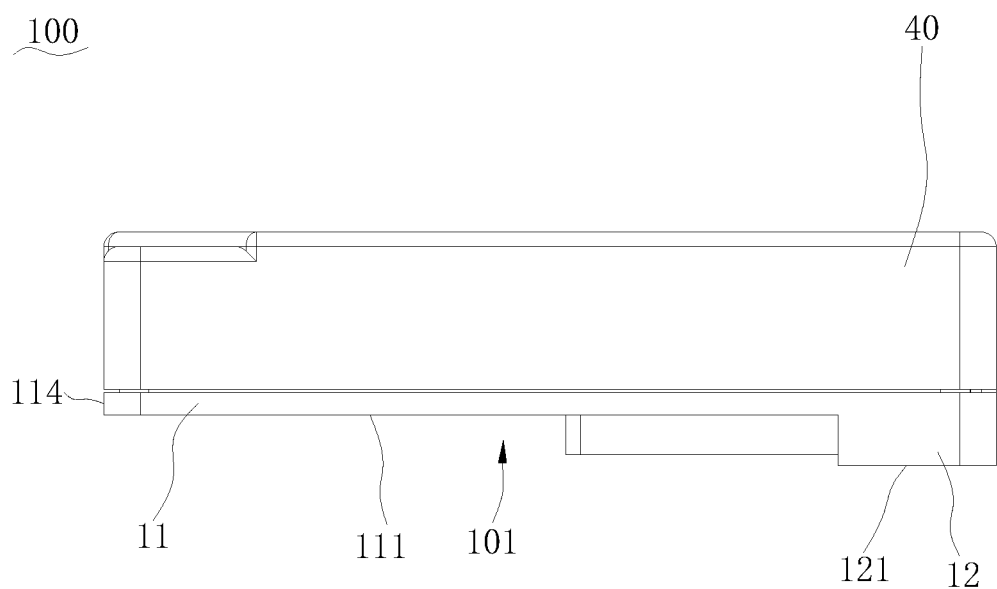
FIG. 9 is a front view of the camera motor in FIG. 5.
Figure 10:
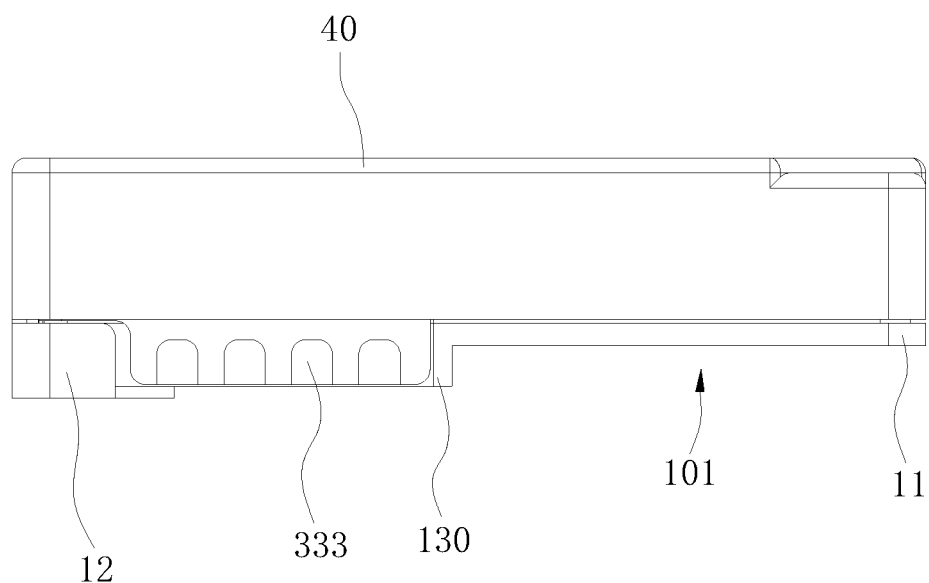
FIG. 10 is a rear view of the camera motor in FIG. 5.

Referring to FIGS. 8 and 9, in some embodiments, the second mounting portion 12 is disposed on a side of the first mounting portion 11, and the receiving slot 101 passes through a side wall 114 on another side of the first mounting portion 11 different from the second mounting portion 12. In this way, the receiving slot 101 passing through the side wall 114 allows for more space in the receiving slot 101, thereby allowing for the placement of larger components. For example, when a larger area image sensor 300 is required to be placed to improve imaging quality, the receiving slot 101 passing through the side wall 114 may enable the receiving slot 101 to have sufficient space to place the image sensor 300. It is to be noted that in the embodiments shown in FIG. 9, the receiving slot 101 passes through all the side walls of the first mounting portion 11 different from the side where the second mounting portion 12 is located. It can be understood that in other embodiments, the receiving slot 101 may pass through any one or more of side walls of the first mounting portion 11 different from the side where the second mounting portion 12 is located. For example, the receiving slot 101 may pass through only the side wall of the first mounting portion 11 back from the second mounting portion 12, without limitation herein.

Figure 6:
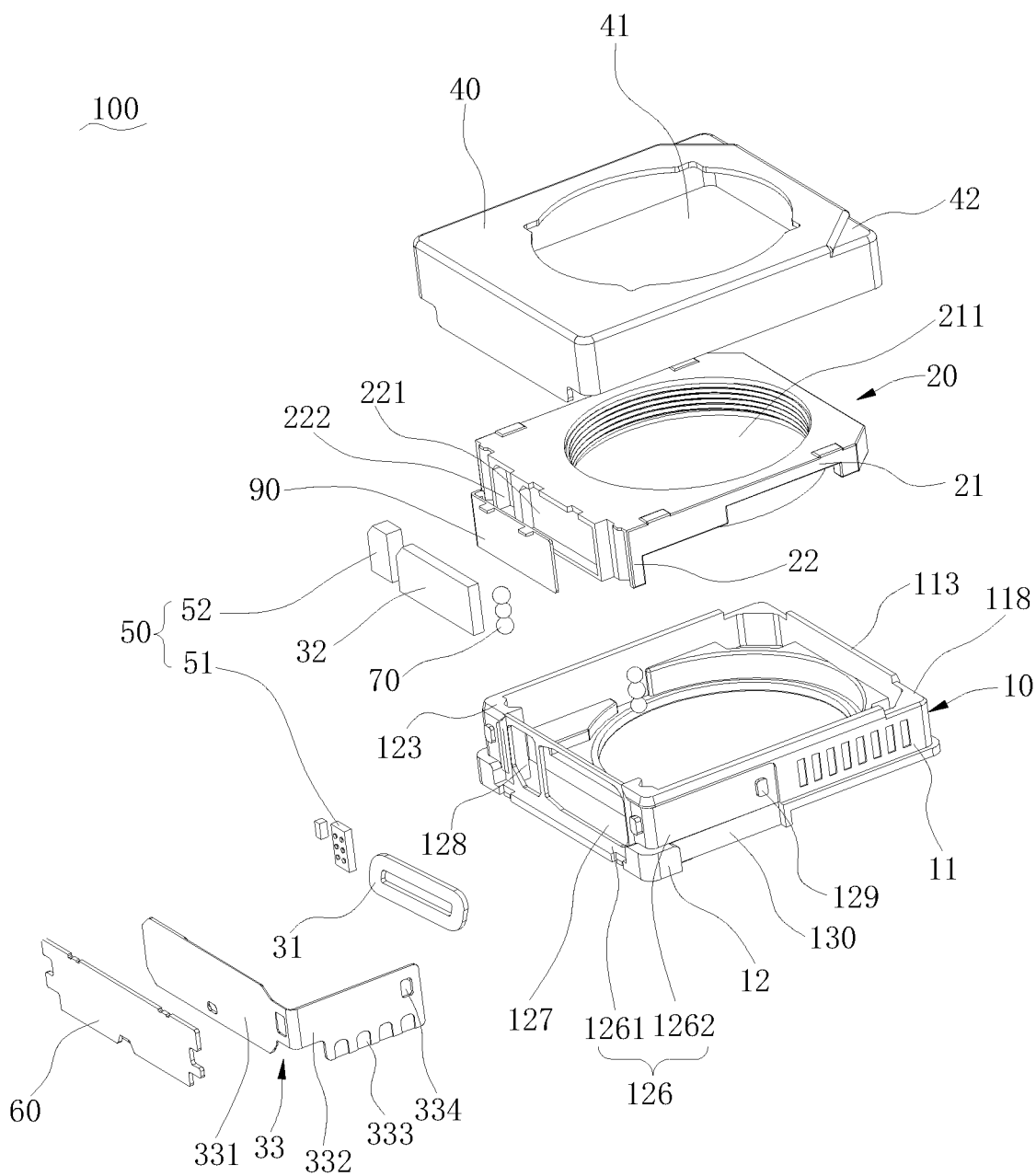
FIG. 6 is an exploded structural schematic view of a camera motor according to an embodiment of the present disclosure.

Referring to FIGS. 6 and 8, the carrying member 20 includes a first carrying portion 21 and a second carrying portion 22. The first carrying portion 21 is arranged in the first mounting cavity 112, and the second carrying portion 22 is arranged in the second mounting cavity 122; the first carrying portion 21 is configured to arrange the lens 500, and the second carrying portion 22 is connected to the drive member 30.

Specifically, in some embodiments, the second carrying portion 22 is disposed on a side of the first carrying portion 21, the shape of the first carrying portion 21 matches the shape of the first mounting portion 11, and the second carrying portion 22 matches the shape of the second mounting portion 12. That is, the first carrying portion 21 and the second carrying portion 22 can be each arranged on a corresponding mounting portion.

It can be understood that in some embodiments, the carrying member 20 may be a one-piece structure, that is, the first carrying portion 21 and the second carrying portion 22 may be molded in one piece. The carrying member 20 may be made of plastic material, for example, by injection molding using a mold to directly form the first carrying portion 21 and the second carrying portion 22. Of course, in some embodiments, the carrying member 20 may be made of other materials, such as metal, etc., and the carrying member 20 may be formed by mechanical processing, such as CNC machining plant, without limitation herein.

In some embodiments, the first carrying portion 21 defines a mounting hole 211, and the mounting hole 211 is configured to arrange the lens 500.

In this way, the lens 500 may be stably arranged on the carrying member 20 through the mounting hole 211 to enable the carrying member 20 to drive the lens 500 to move along the optical axis X to achieve autofocus. Specifically, in the present disclosure, the mounting hole 211 may be a threaded hole, and the lens 500 is threaded, and the two are threaded together, with a center axis of the mounting hole 211 coinciding with the optical axis X of the lens 500.

Further, in some embodiments, the first mounting portion 11 defines a first through hole 115 passing through the first bottom surface 111, and the first through hole 115 is communicated with the first mounting cavity 112 and the receiving slot 101 and is concentric with the mounting hole 211.

In this way, when the light filter module 200 and/or the image sensor 300 are arranged in the receiving slot 101, the light entering from the lens 500 can enter the light filter module 200 through the first through hole 115 and thus enable the image sensor 300 to receive the light for imaging.

Referring to FIGS. 6 and 8, in some embodiments of the present disclosure, the drive member 30 includes a coil 31, a first magnetic member 32, and a circuit board 33. The circuit board 33 is arranged on a side wall 126 of the second mounting portion 12, the coil 31 is arranged on the circuit board 33, the first magnetic member 32 is fixedly arranged on the second carrying portion 22, the first magnetic member 32 and the coil 31 are arranged opposite each other, and the coil 31 can be energized to cause the first magnetic member 32 to drive the carrying member 20 to move along the optical axis X of the lens 500, thereby driving the lens 500 to move to achieve the automatic focusing of the camera module 1000.

Referring to FIG. 6, in some embodiments, a second through hole 127 is defined in the side wall 126 of the second mounting portion 12, and the coil 31 is arranged on the circuit board 33 and disposed in the second through hole 127. In this way, arranging the coil 31 inside the second through hole 127 may effectively reduce the space occupied by the coil 31 in the radial direction of the camera motor 100, such that the size of the camera motor 100 may be made smaller.

Specifically, in some embodiments, the circuit board 33 is basically "L" shaped, and the circuit board 33 includes a first portion 331 and a second portion 332 that are perpendicular to each other. The second mounting portion 12 includes a first side wall 1261 and a second side wall 1262 that are perpendicular to each other and intersect, the first side wall 1261, the second side wall 1262, and the second bottom surface 121 together enclose the second mounting cavity 122. The first portion 331 of the circuit board 33 is arranged on the first side wall 1261, the second portion 332 is arranged on the second side wall 1262, the coil 31 is arranged on the first portion 331 of the circuit board 33, and the second through hole 127 is defined in the first side wall 1261.

In addition, in order to achieve the positioning and fixing of the circuit board 33, a positioning tab 129 may be formed on each of the first side wall 1261 and the second side wall 1262, and a positioning hole 334 may be defined on each of the first portion 331 and the second portion 332 of the circuit board 33. Each positioning tab 129 may cooperate with a corresponding positioning hole 334 to achieve the positioning and mounting of the circuit board 33. In this way, the circuit board 33 may be set up and mounted in such a way that the camera motor 100 has a more compact structure, making the camera motor 100 smaller in size. It is understood that in the embodiments of the present disclosure, the circuit board 33 may be fixed to the second mounting portion 12 by means of dispensing glue.

Referring to FIG. 6, in some embodiments, the camera motor 100 may further include an enhancement plate 60, the first portion 331 of the circuit board 33 is arranged on the enhancement plate 60, and the enhancement plate 60 is arranged on the second mounting portion 12.

In this way, the enhancement plate 60 may effectively support the circuit board 33 to increase the strength of the circuit board 33, so as to carry and support the coil 31 and a detection member 51 in a stable manner.

Figure 11:
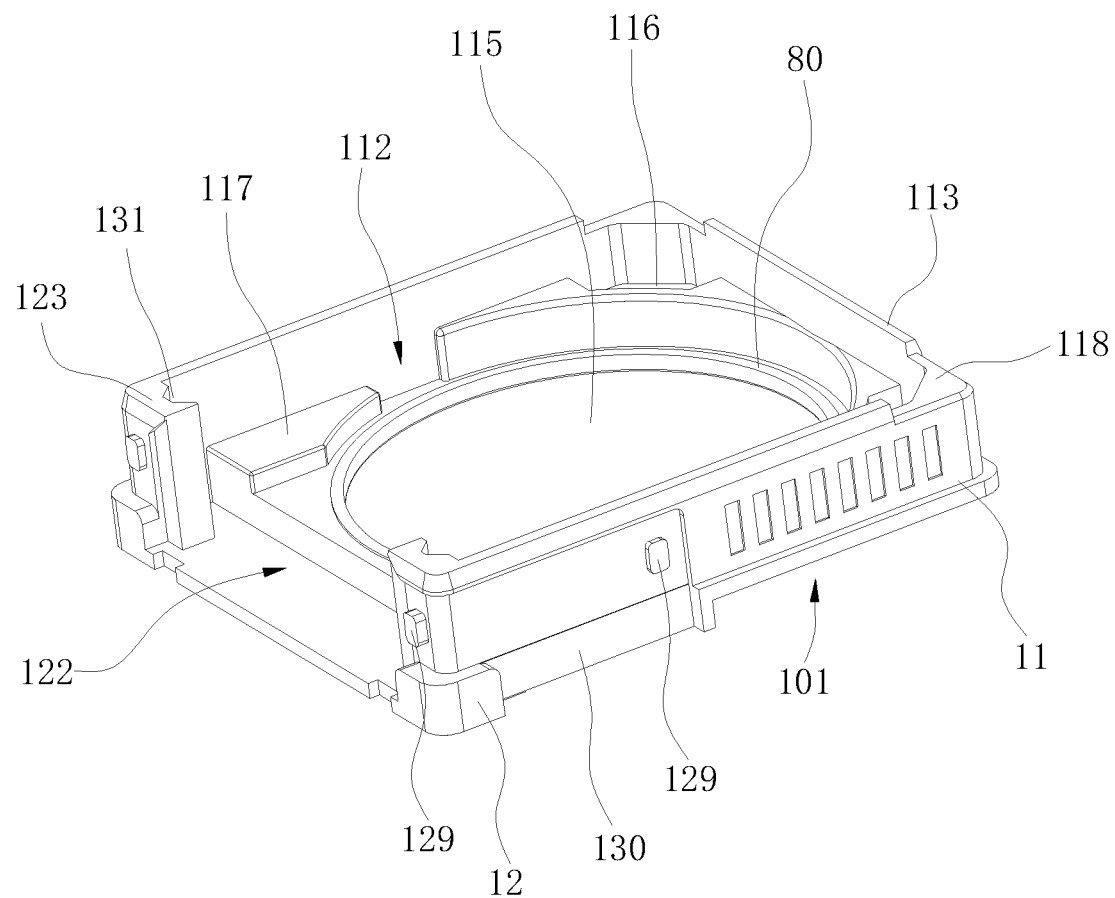
FIG. 11 is a structural schematic view of a base of a camera motor according to an embodiment of the present disclosure.
Figure 12:
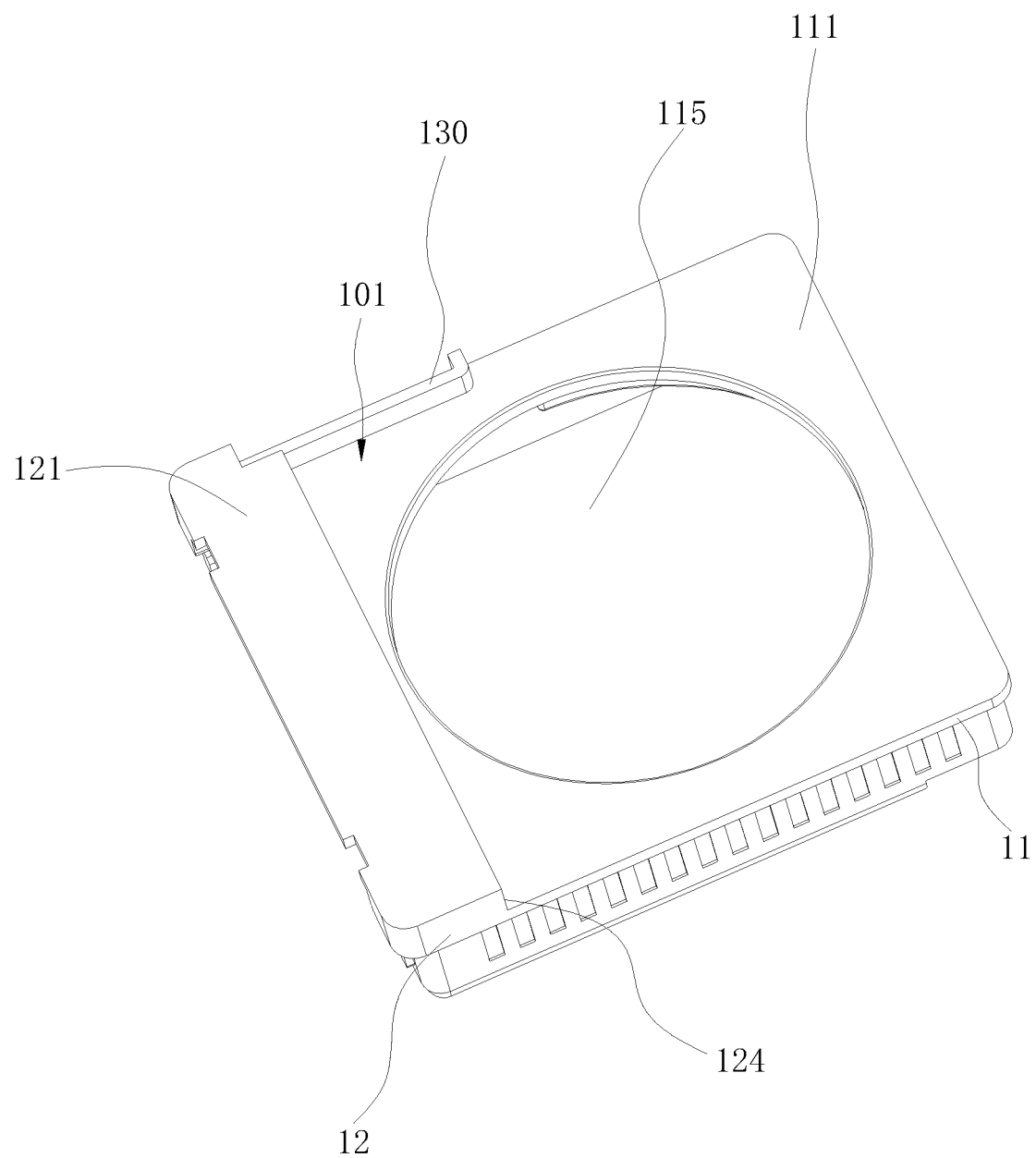
FIG. 12 is a bottom view of the base of the camera motor in FIG. 11.

It can be understood that in some embodiments, the first side wall 1261 of the second mounting portion 12 may be a metal embedded member, i.e., in the embodiments, components of the base 10 other than the first side wall 1261 may be molded in one piece and made of plastic material, and the first side wall 1261 is embedded in the base 10. For example, as shown in FIG. 11, which illustrates a base 10 without the first side wall 1261, in such an embodiment, injection molding may be performed on a metal embedded member such that the metal embedded member is formed as the first side wall 1261 of the second mounting portion 12, thereby forming the entire base 10. In this way, the first side wall 1261 is made of metal, which has a high deformation strength and can effectively improve the strength of the first side wall 1261 to stably support the circuit board 33. Of course, in some embodiments, the second side wall 1262 may be integrally molded with the rest of the base 10, for example, be injection molded directly into one piece, as long as the strength of the first side wall 1261 is ensured, without specific limitation herein.

Further, referring to FIG. 6, in some embodiments, a first mounting slot 221 is defined on the second carrying portion 22, and the first magnetic member 32 is arranged in the first mounting slot 221. In this way, the first magnetic member 32 may be accommodated in the second carrying portion 22, which may effectively reduce the occupied space of the first magnetic member 32 and make the size of the camera motor 100 smaller. It is understood that in the present disclosure, after the coil 31 is energized, the coil 31 generates a magnetic field, and the first magnetic member 32 may be a magnet, and the magnet moves under the action of the magnetic field generated by the coil 31, thereby causing the carrying member 20 to move along the optical axis X of the lens 500 and thus driving the lens 500 to move along the optical axis X to achieve the focusing of the camera module 1000.

Figure 7:
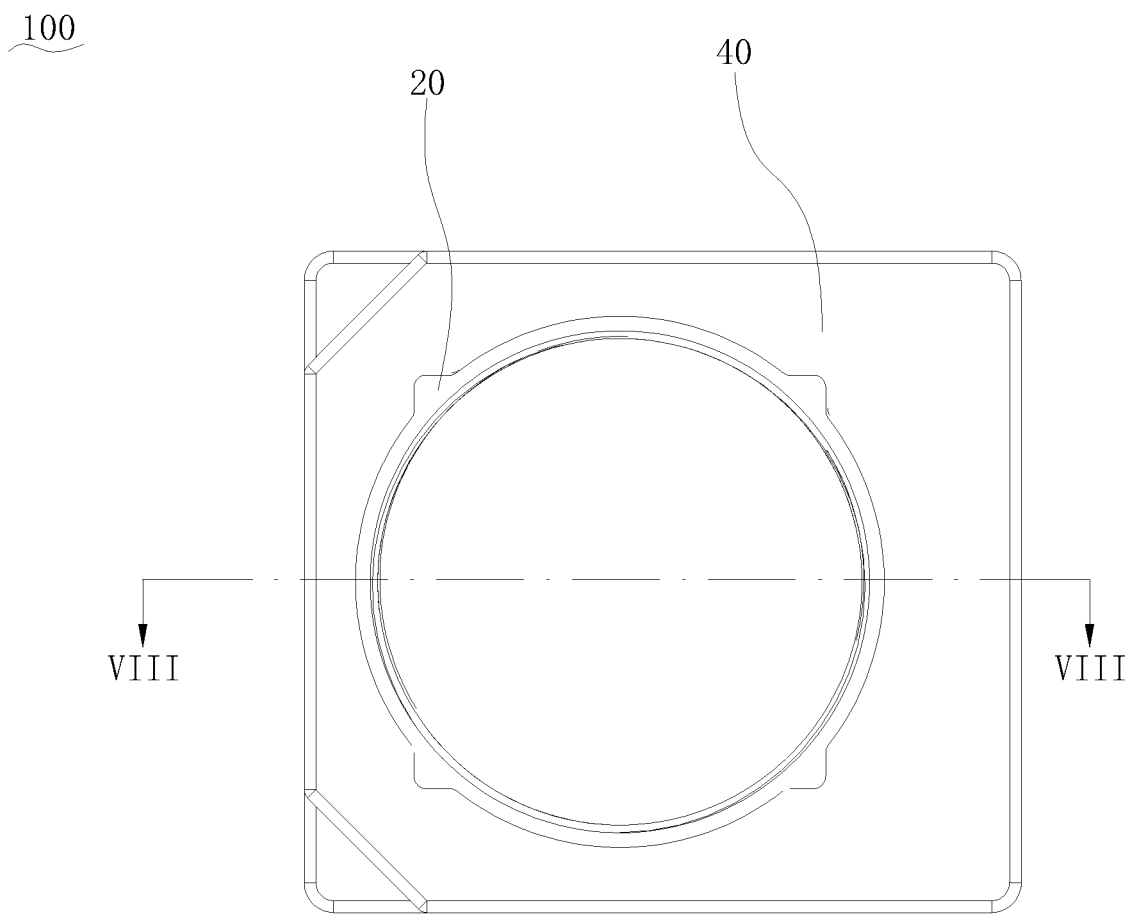
FIG. 7 is a top view of the camera motor in FIG. 5.

Referring to FIG. 7, in some embodiments of the present disclosure, the camera motor 100 may further include a position detection part 50, and the position detection part 50 includes a detection member 51 and a sensing member 52. The detection member 51 is arranged on the second mounting portion 12, and the sensing member 52 is arranged on the second carrying portion 22; the detection member 51 is configured to sense the position of the sensing member 52, so as to detect the relative position of the carrying member 20 and the base 10.

In this way, the position detection part 50 can detect the relative position of the carrying member 20 and the base 10 so as to detect the moving distance of the carrying member 20 to provide feedback on the position of the carrying member 20, and thereby realize the closed-loop control of the movement of the carrying member 20.

Specifically, the sensing member 52 may be arranged on the circuit board 33 such that the sensing member 52 is fixed relative to the second mounting portion 12. In the focusing process of the camera module 1000, the detection member 51 senses the position of the sensing member 52 in real time to detect the position of the carrying member 20. When the carrying member 20 moves to move the lens 500 to a preset position, such as moving to a position of successful focusing, the sensing member 52 senses the position of the carrying member 20, and the sensing member 52 transmits a detection signal to the circuit board 33 and a main board of the electronic device 2000 including the camera module 1000, thereby controlling to stop energizing the coil 31 to stop driving the movement of the carrying member 20.

In some embodiments, the detection member 51 may include a Hall sensor and the sensing member 52 may include a second magnetic member. The Hall sensor can detect the relative position of the carrying member 20 to the base 10, by sensing the magnetic field strength to detect the relative position of the Hall sensor and the second magnetic member.

Specifically, in some embodiments, the second magnetic member may be a magnet, and when the carrying member 20 moves, the carrying member 20 drives the second magnetic member to move, thereby causing the distance between the second magnetic member and the Hall sensor to change. At the same time, the magnetic field strength detected by the Hall sensor will also change, and the Hall sensor can calculate the moving distance of the carrying member 20 based on the change in the magnetic field strength, thereby obtaining the relative position of the carrying member 20 and the base 10.

It is understood that in some embodiments, the detection member 51 may be an infrared sensor, and the infrared sensor may transmit and receive infrared light. The sensing member 52 may be a reflecting member, capable of reflecting infrared light, arranged on the second carrying portion 22. The detection member 51 and the sensing member are arranged at intervals relative to each other. The infrared light transmitted by the infrared sensor may be reflected back by the reflecting action of the reflecting member, and the infrared sensor may calculate the distance between the infrared sensor and the reflecting member based on the time difference between transmitting infrared light and receiving infrared light, and then obtain the distance of the movement of the carrying member 20 relative to the base 10, so as to achieve feedback on the position of the carrying member 20 to achieve closed-loop control of the movement of the carrying member 20.

Of course, it is also understood that in some embodiments, the infrared sensor may include a transmitter and a receiver, and the transmitter may be arranged on the circuit board 33 and the receiver may be arranged on the carrying member 20, such that the receiver may calculate the distance between the transmitter and the receiver based on the time between the transmitter transmitting infrared light and the receiver receiving infrared light, thereby detecting the position of the carrying member 20.

Referring to FIG. 6, in some embodiments, a third through hole 128 may be defined on the side wall 126 of the second mounting portion 12, and the Hall sensor may be disposed in the third through hole 128. A second mounting slot 222 is defined on the second carrying portion 22, and the second magnetic member is arranged in the second mounting slot 222.

In this way, arranging the Hall sensor in the third through hole 128 and arranging the second magnetic member in the second mounting slot 222 may effectively reduce the space occupied by the Hall sensor and the second magnetic member in the radial direction of the camera motor 100, making the size of the camera motor 100 smaller.

Further, referring to FIG. 6, in some embodiments, the second carrying portion 22 may be arranged with a metal embedded member 90 in the second mounting slot 222, the metal embedded member 90 being buried in the second carrying portion 22, and the second magnetic member being arranged on the metal embedded member 90.

In this way, the metal embedded member 90 may increase the strength of the second carrying portion 22 to improve the reliability of the mounting of the second magnetic member.

Referring to FIGS. 5 and 6, in some embodiments of the present disclosure, the housing 40 is sleeved over the base 10, that is, in the present embodiments, the carrying member 20 is arranged in the base 10 and the housing 40 is sleeved over the base 10 to protect components in the base 10. The housing 40 may define a fourth through hole 41 concentric with the mounting hole 211, and the lens 500 may be driven by the carrying member 20 to extend outside of the housing 40 through the fourth through hole 41.

Referring to FIG. 6 and FIGS. 10 to 12, in some embodiments, the second side wall 1262 of the second mounting portion 12 is further arranged with a retaining wall 130, which is exposed to an outside of the housing 40. The first portion 331 of the circuit board 33 is disposed inside the housing 40, and a pin 333 on the second portion 332 of the circuit board 33 abuts against on the retaining wall 130 and is exposed from the housing 40 such that the pin 333 can be connected to the main board of the electronic device 2000 arranged with the camera module 1000. In this way, only the pin 333 of the circuit board 33 of the entire camera motor 100 is exposed from the inside of the housing 40 to be connected to the main board of the electronic device 2000, and the camera module 1000 is more compact and aesthetically pleasing.

Figure 14:
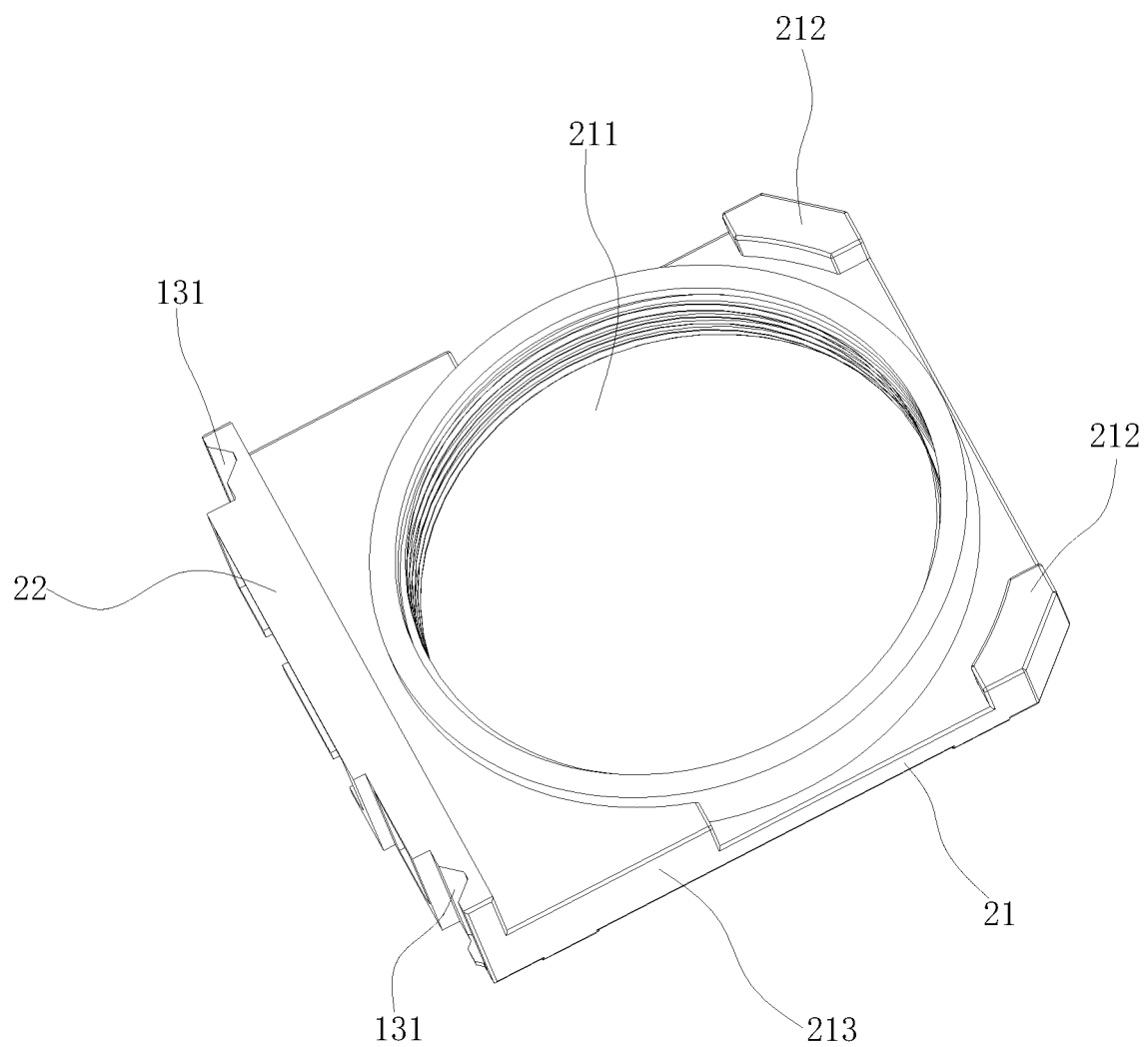
FIG. 14 is a bottom view of the carrying member of the camera motor in FIG. 13.

Referring to FIG. 6, FIG. 11 and FIG. 14, in some embodiments of the present disclosure, the carrying member 20 is able to move within the base 10 along the optical axis X of the lens 500. The inner wall of the base 10 is formed with a ball track 131, and a corresponding part of the carrying member 20 is formed with another ball track 131. A ball 70 is arranged between the two ball tracks 131, and the ball 70 rolls within the ball track 131 when the carrying member 20 rolls relative to the base 10. In this way, the base 10 and the carrying member 20 are connected to each other through the ball 70, and the friction between the ball 70 and the carrying member 20 as well as the base 10 is rolling friction, which is small in value.

Figure 13:
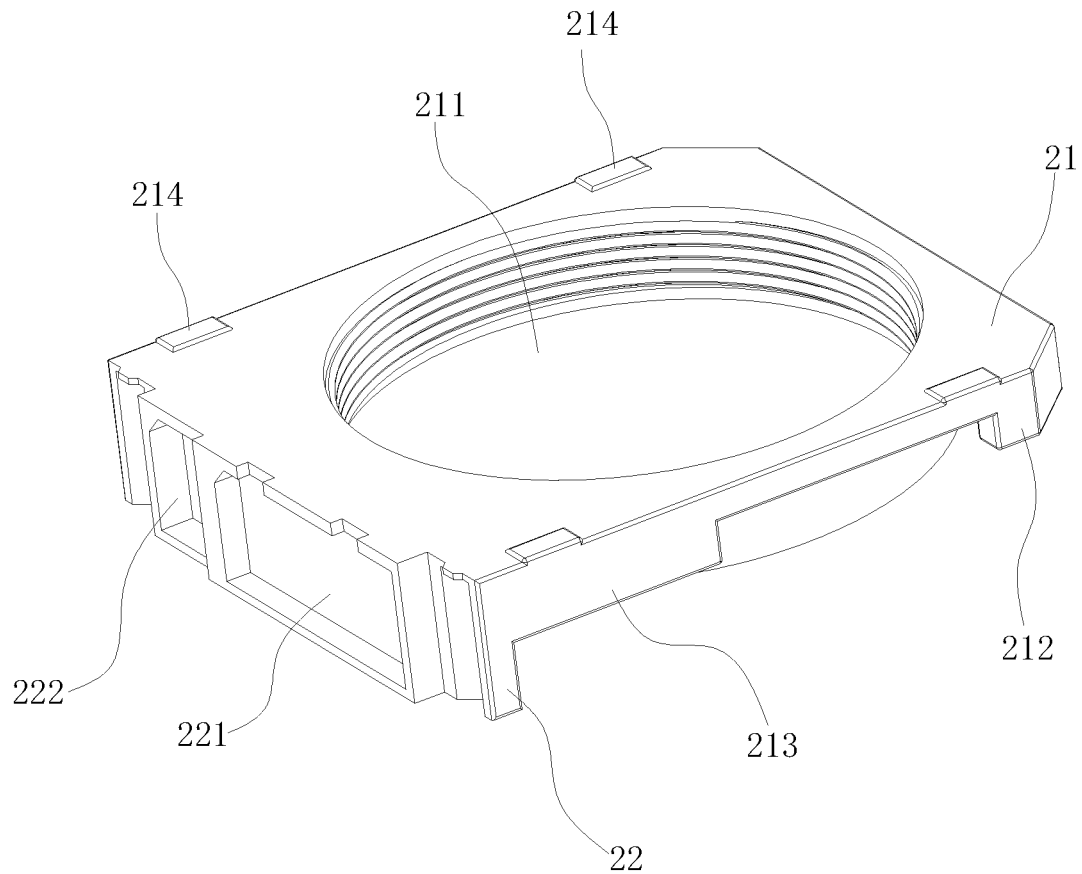
FIG. 13 is a structural schematic view of a carrying member of a camera motor according to an embodiment of the present disclosure.

Referring to FIG. 11, FIG. 13, and FIG. 14, in some embodiments, a recess 116 is defined in the first mounting cavity 112 of the first mounting portion 11, a first impact tab 212 is formed on a bottom of the first carrying portion 21, and the first impact tab 212 is arranged facing the recess 116. When the carrying member 20 moves along the optical axis X of the lens 500 toward the bottom of the base 10 to a limit position, the first impact tab 212 cooperates with the groove 116.

In this way, the above design is convenient to position the carrying member 20 and the base 10; further, by virtue of the cooperation between the first impact tab 212 and the recess 116, the contact area when the carrying member 20 and the base 10 collide is smaller, thereby making the collision generated by the vibration is small to prevent excessive vibration from affecting the imaging quality of the camera module 1000.

In addition, referring to FIG. 11, FIG. 13 and FIG. 14 again, in some embodiments, the bottom of the first carrying portion 21 is further formed with a support tab 213, and the first mounting portion 11 is formed with a carrying tab 117 at a position facing the support tab 213. The support tab 213 abuts against the carrying tab 117.

In this way, the support tab 213 and the carrying tab 117 may enable the base 10 to carry the member 20 stably.

Referring to FIG. 13, in some embodiments, a top of the first carrying portion 21 is formed with a second impact tab 214, and the second impact tab 214 protrudes from a top surface of the first carrying portion 21.

In this way, when the carrying member 20 moves along the optical axis X of the lens 500 toward the bottom of the base 10 to the limit position, the second impact tab 214 is the first to collide with the housing 40, and the contact area between the two is smaller and the vibration generated is smaller, thereby preventing excessive vibration from affecting the imaging quality of the camera module 1000.

Referring to FIG. 6 and FIG. 11, in some embodiments, a part of the first top surface 113 of the first mounting portion 11 of the base 10 is recessed downward to define an avoidance slot 118, and the housing 40 is formed with a limit tab 42. The limit tab 42 cooperates with the avoidance slot 118 when the housing 40 is arranged on the base 10. In this way, the limit tab 42 and the avoidance slot 118 may position the housing 40 to improve the mounting efficiency.

Further, referring to FIG. 11, in some embodiments, a dustproof ring 80 is arranged on a hole wall of the first through hole 115.

In this way, the dustproof ring 80 may seal a gap between the first carrying portion 21 and the first mounting portion 11, thereby preventing dust or impurities inside the camera motor 100 from falling into the receiving slot 101 through the first through hole 115 and contaminating the light filter module 200 and/or the image sensor 300 and affecting the imaging quality.

In summary, the electronic device of the present disclosure includes a camera module 1000, the camera module 1000 includes a camera motor 100, the camera motor 100 includes a base 10, a carrying member 20, and a drive member 30, a bottom surface of the base 10 is recessed to define a receiving slot 101, and the receiving slot 101 passes through a side of the base 10. The receiving slot 101 is configured to receive at least one of the light filter module 200, the image sensor 300, and the sensor circuit board 400 of the camera module 1000. The carrying member 20 is configured to carry the lens 500, and the carrying member 20 is arranged in the base 10 and can move along the optical axis X of the lens in the base 10. The drive member 30 is connected to the carrying member 20 and is configured to drive the carrying member 20 to move along the optical axis X of the lens 500 within the base 10.

In the camera motor 100, the camera module 1000, and the electronic device 2000 of the present disclosure, the bottom surface of the base 10 is recessed to define the receiving slot 101, which can be configured to place at least one of the light filter module 200, the image sensor 300, and sensor circuit board 400 of the camera module 1000, thereby effectively reducing the height of the camera module 1000. In addition, the receiving slot 101 passes through a side of the base 10 and is thus connected to the outside, such that the housing space formed by the receiving slot 101 is larger and a larger area of the light filter module 200 and the image sensor 300 can be placed to improve the imaging quality of the camera module 1000.

In the description of this specification, reference to the terms "certain embodiment", "an embodiment", "some embodiments", "schematic embodiment", "example", "specific example", or "some examples" means that a specific feature, structure, material, or characteristic described in connection with the embodiment or example is included in at least one embodiment or example of the present disclosure. In this specification, the schematic expressions for the above terms do not necessarily refer to the same embodiment or example. Moreover, the specific feature, structure, material, or characteristic described may be combined in any one or more of the embodiments or examples in a suitable manner.

Although embodiments of the present disclosure have been shown and described above, it is understood that the above embodiments are exemplary and are not to be construed as limiting the present disclosure, and that variations, modifications, replacements and variants of the above embodiments may be made by those skilled in the art within the scope of the present disclosure, which is limited by the claims and their equivalents.

What is claimed is:

1. A camera motor, applied to a camera module, comprising:
a base; wherein a bottom surface of the base is recessed to define a receiving slot, and the receiving slot passes through a side of the base; the receiving slot is configured to receive at least one of a light filter module, an image sensor, and a sensor circuit board of the camera module;
a carrying member, configured to carry a lens, arranged in the base, and movable along an optical axis of the lens within the base; and
a drive member, connected to the carrying member and configured to drive the carrying member to move along the optical axis of the lens;
wherein the carrying member comprises a first carrying portion and a second carrying portion connected to the first carrying portion, the first carrying portion is configured to arrange the lens, the second carrying portion is connected to the drive member;
a top of the first carrying portion is formed with a plurality of impact tabs, and the plurality of impact tabs are arranged at intervals.

2. The camera motor according to claim 1, wherein the base comprises a first mounting portion and a second mounting portion, and the second mounting portion is connected to a side of the first mounting portion; the first mounting portion comprises a first bottom surface, and the second mounting portion comprises a second bottom surface; a position of the first bottom surface is lower than a position of the second bottom surface; an inner surface of the receiving slot comprises the first bottom surface and a side surface of the second mounting portion; wherein the first bottom surface and the second bottom surface are stepped and connected by the side surface, and the receiving slot penetrates a side wall of the first mounting portion back from the second mounting portion.

3. The camera motor according to claim 2, wherein the first mounting portion further comprises a first top surface, and the second mounting portion further comprises a second top surface; the first top surface and the second top surface are flush, a part of the first top surface of the first mounting portion of the base is recessed downward to define an avoidance slot.

4. The camera motor according to claim 2, wherein the first mounting portion defines a first mounting cavity, and the second mounting portion defines a second mounting cavity; the first carrying portion is arranged in the first mounting cavity, and the second carrying portion is arranged in the second mounting cavity; the second carrying portion is arranged with a metal embedded member in the second mounting slot, and the metal embedded member is buried in the second carrying portion.

5. The camera motor according to claim 4, wherein the first carrying portion defines a mounting hole configured to arrange the lens, and a center axis of the mounting hole coincides with the optical axis of the lens.

6. The camera motor according to claim 5, wherein the first mounting portion defines a first through hole passing through the first bottom surface, and the first through hole is communicated with the first mounting cavity and the receiving slot and is concentric with the mounting hole.

7. The camera motor according to claim 4, wherein the drive member comprises a coil and a first magnetic member; the coil is arranged on the second mounting portion, and the first magnetic member is fixedly arranged on the second carrying portion; the first magnetic member and the coil are arranged opposite each other, and the coil is capable of causing the first magnetic member to drive the carrying member to move along the optical axis of the lens in response to the coil being energized.

8. The camera motor according to claim 7, wherein the drive member further comprises a circuit board arranged on a side wall of the second mounting portion; the coil is arranged on the circuit board and is electrically connected to the circuit board.

9. The camera motor according to claim 8, wherein the side wall of the second mounting portion defines a second through hole, and the coil is arranged in the second through hole.

10. The camera motor according to claim 8, wherein the circuit board comprises a first portion and a second portion that are perpendicular to each other; the second mounting portion comprises a first side wall and a second side wall that are perpendicular to each other and intersect; the first side wall, the second side wall, and the second bottom surface together enclose to define the second mounting cavity; the first portion is arranged on the first side wall, the second portion is arranged on the second side wall, and the coil is arranged on the first portion.

11. The camera motor according to claim 10, wherein a positioning tab is formed on each of the first side wall and the second side wall, and a positioning hole is defined on each of the first portion and the second portion; each positioning tab cooperates with a corresponding positioning hole.

12. The camera motor according to claim 10, further comprising an enhancement plate; wherein the first portion is arranged on the enhancement plate, and the enhancement plate is arranged on the second mounting portion.

13. The camera motor according to claim 7, wherein the second carrying portion defines a first mounting slot, and the first magnetic member is arranged in the first mounting slot.

14. The camera motor according to claim 4, further comprising a position detection part comprising a detection member and a sensing member; wherein the detection member is arranged on the second mounting portion, and the sensing member is arranged on the second carrying portion; the detection member is configured to sense a position of the sensing member, for detecting a relative position of the carrying member and base.

15. The camera motor according to claim 14, wherein the detection member comprises a Hall sensor and the sensing member comprises a second magnetic member; the Hall sensor is configured to detect the relative position of the carrying member and the base, by sensing a magnetic field strength to detect a relative position of the Hall sensor and the second magnetic member; the second magnetic member is arranged on the metal embedded member.

16. The camera motor according to claim 15, wherein a side wall of the second mounting portion defines a third through hole, and the Hall sensor is disposed in the third through hole; the second carrying portion defines a second mounting slot, and the second magnetic member is arranged in the second mounting slot.

17. The camera motor according to claim 14, wherein the detection member comprises an infrared sensor, and the sensing member comprises a reflecting member, capable of reflecting infrared light and arranged on the second carrying portion.

18. A camera module, comprising:
a camera motor, comprising:
   a base; wherein a bottom surface of the base is recessed to define a receiving slot, and the receiving slot passes through a side of the base; the receiving slot is configured to receive at least one of a light filter module, an image sensor, and a sensor circuit board of the camera module;
   a carrying member, configured to carry a lens, arranged in the base, and movable along an optical axis of the lens within the base; and
   a drive member, connected to the carrying member and configured to drive the carrying member to move along the optical axis of the lens; and
the at least one of the light filter module, the image sensor, and the sensor circuit board, arranged in the receiving slot;
wherein the carrying member comprises a first carrying portion and a second carrying portion connected to the first carrying portion, the first carrying portion is configured to arrange the lens, the second carrying portion is connected to the drive member;
a top of the first carrying portion is formed with a plurality of impact tabs, and the plurality of the impact tabs are arranged at intervals.

19. The camera module according to claim 18, wherein the light filter module comprises a bracket and a filter; the filter is arranged on the bracket, the bracket is received in the receiving slot, and the image sensor is disposed under the bracket.

20. An electronic device, comprising:
a shell; and
a camera module, arranged in the shell;
wherein the camera module comprises:
   a camera motor, comprising:
      a base; wherein a bottom surface of the base is recessed to define a receiving slot, and the receiving slot passes through a side of the base; the receiving slot is configured to receive at least one of a light filter module, an image sensor, and a sensor circuit board of the camera module;
      a carrying member, configured to carry a lens, arranged in the base, and movable along an optical axis of the lens within the base; and
      a drive member, connected to the carrying member and configured to drive the carrying member to move along the optical axis of the lens; and
   the at least one of the light filter module, the image sensor, and the sensor circuit board, arranged in the receiving slot;
wherein the carrying member comprises a first carrying portion and a second carrying portion connected to the first carrying portion, the first carrying portion is configured to arrange the lens, the second carrying portion is connected to the drive member;
a top of the first carrying portion is formed with a plurality of impact tabs, and the plurality of the impact tabs are arranged at intervals.

* * * * *